US006844734B2

United States Patent
Fukuda et al.

(10) Patent No.: US 6,844,734 B2
(45) Date of Patent: Jan. 18, 2005

(54) CURRENT DETECTION CIRCUIT FOR A/F SENSOR

(75) Inventors: Teruhisa Fukuda, Kobe (JP); Hiroshi Moriguchi, Kobe (JP); Kazutaka Hattori, Susono (JP); Shinji Ikeda, Mishima (JP)

(73) Assignees: Fujitsu Ten Limited, Kobe (JP); Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/367,281

(22) Filed: Feb. 14, 2003

(65) Prior Publication Data

US 2003/0155931 A1 Aug. 21, 2003

(30) Foreign Application Priority Data

Feb. 18, 2002 (JP) ........................................ 2002-040127

(51) Int. Cl.⁷ ............................. F02P 17/00; G01N 7/00
(52) U.S. Cl. ........................................ 324/378; 73/23.32
(58) Field of Search ............................ 73/23.32, 31.05; 324/378, 522, 71.5, 158.1; 204/424, 425, 408; 123/704

(56) References Cited

U.S. PATENT DOCUMENTS

| 5,980,710 A | * 11/1999 | Kurokawa et al. | .......... 204/425 |
| 2002/0179443 A1 | * 12/2002 | Hada et al. | .................. 204/408 |

FOREIGN PATENT DOCUMENTS

| JP | 10-90218 | 4/1998 |
| JP | 2000-46791 | 2/2000 |
| JP | 2000-329739 | 11/2000 |

OTHER PUBLICATIONS

Patent Abstract of Japan, Publication No. 10090218 A, Published on Apr. 10, 1998, in the name of Schnaibel Eberhard, et al.
Patent Abstract of Japan, Publication No. 2000046791 A, Published on Feb. 18, 2000, in the name of Kurokawa Hidekazu, et al.
Patent Abstract of Japan, Publication No. 2000329739 A, Published on Nov. 30, 2000, in the name of Touwaki Chihiro, et al.

* cited by examiner

*Primary Examiner*—Jay Patidar
*Assistant Examiner*—Amy He
(74) *Attorney, Agent, or Firm*—Christie, Parker and Hale, LLP

(57) ABSTRACT

A highly flexible current detection circuit for an A/F sensor, that can readily provide for a change to an A/F sensor having a difference characteristic. The A/F sensor current detection circuit of the invention comprises: an operational amplifier for generating a voltage to be applied to the A/F sensor; a current-measuring first resistor connected between the operational amplifier and the A/F sensor; voltage-dividing second and third resistors connected in series with each other with one end thereof connected between the operational amplifier and the first resistor; a first output terminal provided between the operational amplifier and the first resistor; a second output terminal provided between the first resistor and the A/F sensor; and a third output terminal provided between the voltage-dividing second and third resistors. When measuring the sensor element admittance with this circuit, the third output terminal is used in place of the first output terminal.

10 Claims, 5 Drawing Sheets

CURRENT DETECTION CIRCUIT FOR A/F SENSOR

CROSS-REFERENCE TO RELATED APPLICATION

This application claims priority from Japanese Patent Application No. 2002-40127, filed on Feb. 18, 2002.

BACKGROUND OF THE INVENTION

1. Field of the Invention

The present invention relates to a current detection circuit for an air/fuel ratio sensor (A/F sensor) used for detecting an air/fuel ratio in an internal combustion engine such as an automotive engine.

2. Prior Art

An A/F sensor is a sensor that monitors the air-to-fuel ratio (A/F ratio), i.e., A/F value, in an exhaust gas. This sensor is used to detect the ratio of air to fuel in the exhaust gas such as automotive exhaust, and to adjust, based on the detected value, the amount of fuel to be supplied to the engine to an optimum value. FIG. 1 shows the relationship between sensor current and A/F ratio in a conventional A/F sensor. The A/F sensor characteristic shown here was measured while applying a voltage of 0.4 V across the sensor. Further, the circuit was adjusted such that the sensor current was zero at stoichiometric point and was negative in the rich range and positive in the lean range.

As shown, the sensor current is substantially proportional to the A/F value, which means that the A/F value can be obtained by detecting the sensor current on the circuit. Further, to obtain the sensor characteristic, the A/F sensor must be activated and, for this purpose, the sensor element is usually preheated to a temperature of 550° C. or higher. The sensor's admittance-temperature characteristic shown in FIG. 2 is used to detect the temperature of the sensor element. Since the admittance-temperature characteristic is unique to each particular sensor, the temperature T1 of the element at a given instant in time can be detected by measuring the element's admittance value Ad1 at that instant and comparing the measured value against a premeasured admittance-temperature characteristic curve. Here, the admittance Ad is the reciprocal of the impedance Z.

To summarize, the A/F sensor processing circuit is required to have two functions: the function (function 1) of monitoring the sensor current in order to obtain the A/F value, and the function (function 2) of detecting the sensor's admittance value in order to obtain the temperature of the sensor element.

FIG. 3 shows a prior art sensor current detection circuit equipped with the above two functions. In the figure, reference numeral 1 is a two-terminal A/F sensor having a positive terminal 2 and a negative terminal 3; as shown, this sensor can be represented in the form of an equivalent circuit as a series circuit of impedance Z and electromotive force E. The two terminals 2 and 3 are connected to an A/F sensor circuit 4 mounted in an ECU (Electronic Control Unit). As shown, the A/F sensor circuit 4 comprises operational amplifiers 5 and 6 and shunt resistors Ra and Rb.

The output terminal of the operational amplifier 5 is connected via the shunt resistor Ra to the positive terminal 2 of the sensor 1. The positive terminal 2 of the sensor 1 is in turn connected to the positive input terminal of the operational amplifier 5. The negative input terminal of the operational amplifier 5 is connected to a variable voltage power supply 7 of a variable voltage V1, while the negative input terminal of the operational amplifier 6 is connected to a fixed voltage power supply of a voltage V2. The operational amplifiers 5 and 6 operate so as to make the voltage values at the positive and negative terminals 2 and 3 of the sensor 1 equal to the voltage V1 of the variable voltage power supply 7 and the voltage V2 of the fixed voltage power supply 8. Each of the operational amplifiers 5 and 6 is connected between a +B power supply and ground.

Reference numeral 9 is an AD converter having terminals AD1 and AD2 for monitoring the voltage across the shunt resistor Ra. The voltage value detected by the converter 9 is sent to a microcomputer not shown, where prescribed processing is performed to compute the sensor current and the admittance value.

The operation of the above sensor current detection circuit 4 will be described below to clarify the drawback of the prior art. First, for simplicity of explanation, it is assumed that the allowable voltage range of the AD converter 9 is from 0 V to 5 V, and that the voltages V1 and V2 are set to 3.3 V and 2.9 V, respectively, for detection of the sensor current.

In the above circuit, the function 1 is carried out by measuring the sensor current=(AD2−AD1)/R while holding the voltage V1 at a constant level (for example, 3.3 V). On the other hand, the function 2 can be accomplished by obtaining the admittance from the amount of change of the current ($\Delta I$) when the voltage V1 is varied ($\Delta V$). The admittance Z of the sensor 1 in this case is given by the equation $$\text{Admittance} = \Delta I / \Delta V \quad (1)$$

Actual voltage sweeping waveforms V1 and V2 are shown in FIG. 4.

The waveform V1 is formed by alternating a period b, during which the voltage is swept with $\Delta V = 0.2$ V, and a constant voltage period a, during which the voltage is held constant, the combined length of the periods a and b being a few hundred milliseconds. The element's admittance can be obtained from the above equation (1) by obtaining the amount of change of the current, $\Delta I$, due to the impedance within the sensor during the voltage sweeping period b, as described above. At this time, the voltage detected by the terminal AD2 of the AD converter 9 rises up to the "B" voltage in terms of a peak value.

On the other hand, the sensor current monitoring function 1 is carried out during the period a where the voltage V1 is held fixed to 3.3 V. At this time, the voltage at the terminal AD2 of the AD converter 9 remains fixed to "A" voltage. As an example, the voltages at the terminals AD1 and AD2 of the AD converter 9 are obtained under the following condition.

<Condition 1>

The sensor current at A/F=18 is 4 [mA], the element's admittance Ad at the element temperature 700° C. used for control is Ad=0.04 [1/Ω], and the shunt resistance Ra is 100 Ω.

In this case, the "A" voltage at the terminal AD2 during the sensor current detection (period a) is given as "A" Voltage=3.3 V+100 Ω×4 mA=3.7 V On the other hand, the peak value B of the AD voltage during the element's admittance computation (period b) is given as "B" Voltage="A" Voltage (3.7 V)+100 Ω×(0.2 V/(1/0.04 [1/Ω])= 4.5 V Since both the "A" and "B" voltages fall within the allowable voltage range of 0 V to 5 V for the conventional AD converter 9, no problem will arise as long as a sensor that matches condition 1 is used. However, if the A/F sensor characteristic changes as a result of a sensor design change, the "B" voltage may exceed the input upper limit value of 5 V of the AD converter. An example of this is shown below.

<Condition 2>

The sensor current at A/F=18 is 4 [mA], as in the condition 1, but as a result of a sensor design change, the element's admittance at the element temperature 700° C. used for control has changed to 0.08 [1/Ω].

The "A" voltage at the terminal AD2 of the AD converter 9 in this case is obtained as follows.

First, during the sensor current detection (period a) the "A" voltage is given as "A" Voltage=3.3 V+100 Ω×4 mA=3.7 V Next, during the element's admittance computation (period b) the "B" voltage is given as "B" Voltage="A" Voltage (3.7 V)+100 Ω×(0.2 V/(1/0.08 [1/Ω])= 5.3 V which exceeds the input upper limit voltage value of the AD converter 9, and as a result, the voltage at the terminal AD2 is stuck at 5 V.

In this way, when the A/F sensor characteristic changes, the voltage at AD2 during the voltage sweeping may exceed the input upper limit voltage value of the converter, and the "B" voltage may become stuck at 5 V. If this happens, the element's admittance cannot be computed accurately. To address such a situation, it is usually practiced to reduce the shunt resistance Ra by one half to 50Ω thereby preventing the "B" voltage from being stuck at the upper limit value of the converter during the voltage sweeping.

If the shunt resistance Ra is reduced to 50Ω, however, the voltage at point A drops from 3.7 V to 3.5 V, and thus, the dynamic range decreases by one half. That is, the drawback is that the accuracy of sensor current detection drops to one half.

As described above, the A/F sensor current detection circuit of the prior art has the drawback that, when a sensor is used that has a characteristic different from the A/F sensor characteristic assumed at the time of designing the circuit, it becomes difficult to accurately detect the element's admittance while maintaining a high accuracy for the detection of the sensor current.

SUMMARY OF THE INVENTION

It is accordingly an object of the present invention to provide a sensor current detection circuit capable of accurately measuring the element's admittance while maintaining the sensor current detection accuracy that can serve the practical purpose, even when an A/F sensor having a different characteristic is used.

To achieve the above object, a first current detection circuit for an A/F sensor, according to the present invention, comprises: an operational amplifier for generating a voltage to be applied to the A/F sensor; a current-measuring first resistor connected between the operational amplifier and the A/F sensor; voltage-dividing second and third resistors connected in series with each other with one end thereof connected between the operational amplifier and the first resistor; a first output terminal provided between the operational amplifier and the first resistor; a second output terminal provided between the first resistor and the A/F sensor; and a third output terminal provided between the voltage-dividing second and third resistors.

According to the first A/F sensor current detection circuit of the present invention, the voltage at the third measuring terminal is lower than the voltage at the first measuring terminal in accordance with the voltage dividing ratio of the second and third resistors. For example, when the second and third resistors have a resistance ratio of 1:1, the voltage at the third output terminal is one-half of the voltage at the first output terminal. Usually, signals from these output terminals are supplied via an AD converter to a microprocessor or the like where a prescribed operation is performed for the detection of the sensor current. Accordingly, when the output of the first output terminal increases excessively during detection of the element's admittance because of the use of an A/F sensor having a different characteristic then, by using the third output terminal in place of the first output terminal, the output voltage can be held within the input voltage range of the AD converter. The invention can thus provide a highly flexible A/F sensor current detection circuit that can readily provide for the replacement of the A/F sensor.

To solve the problem of the prior art, a second current detection circuit for an A/F sensor, according to the present invention, comprises: an operational amplifier for generating a voltage to be applied to the A/F sensor; current-measuring first and second resistors connected in series between the operational amplifier and the A/F sensor; a first output terminal provided between the operational amplifier and the first resistor; a second output terminal provided between the first and second resistors; and a third output terminal provided between the second resistor and the A/F sensor.

According to the second A/F sensor current detection circuit of the present invention, even when an A/F sensor having a different characteristic is used, the output voltage can be held within the input voltage range of the AD converter, as in the first invention described above, by using the second output terminal in place of the first output terminal when detecting the element's admittance. The invention can thus provide a highly flexible A/F sensor current detection circuit that can readily provide for the replacement of the A/F sensor.

DESCRIPTION OF THE PREFERRED EMBODIMENTS

The preferred embodiments of the present invention will be described below with reference to drawings.

Figure 1:
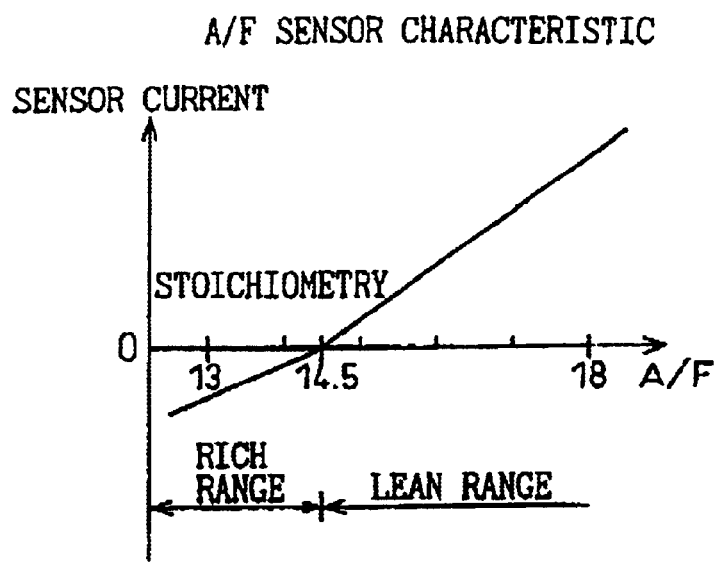
FIG. 1 is a diagram showing the characteristic of a conventional A/F sensor.
Figure 2:
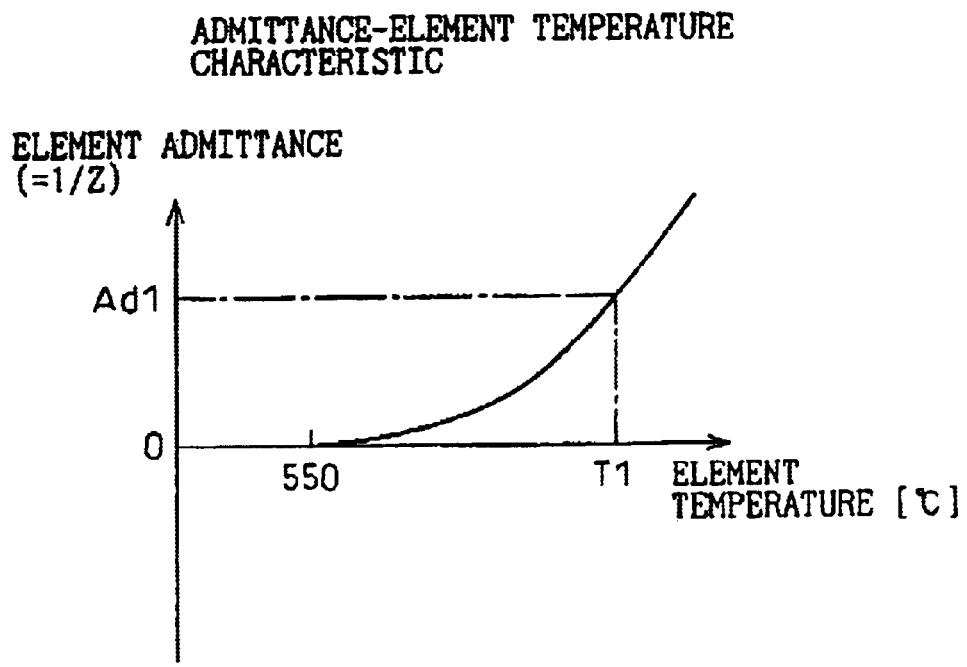
FIG. 2 is a diagram showing the admittance-element temperature characteristic of the conventional A/F sensor.
Figure 3:
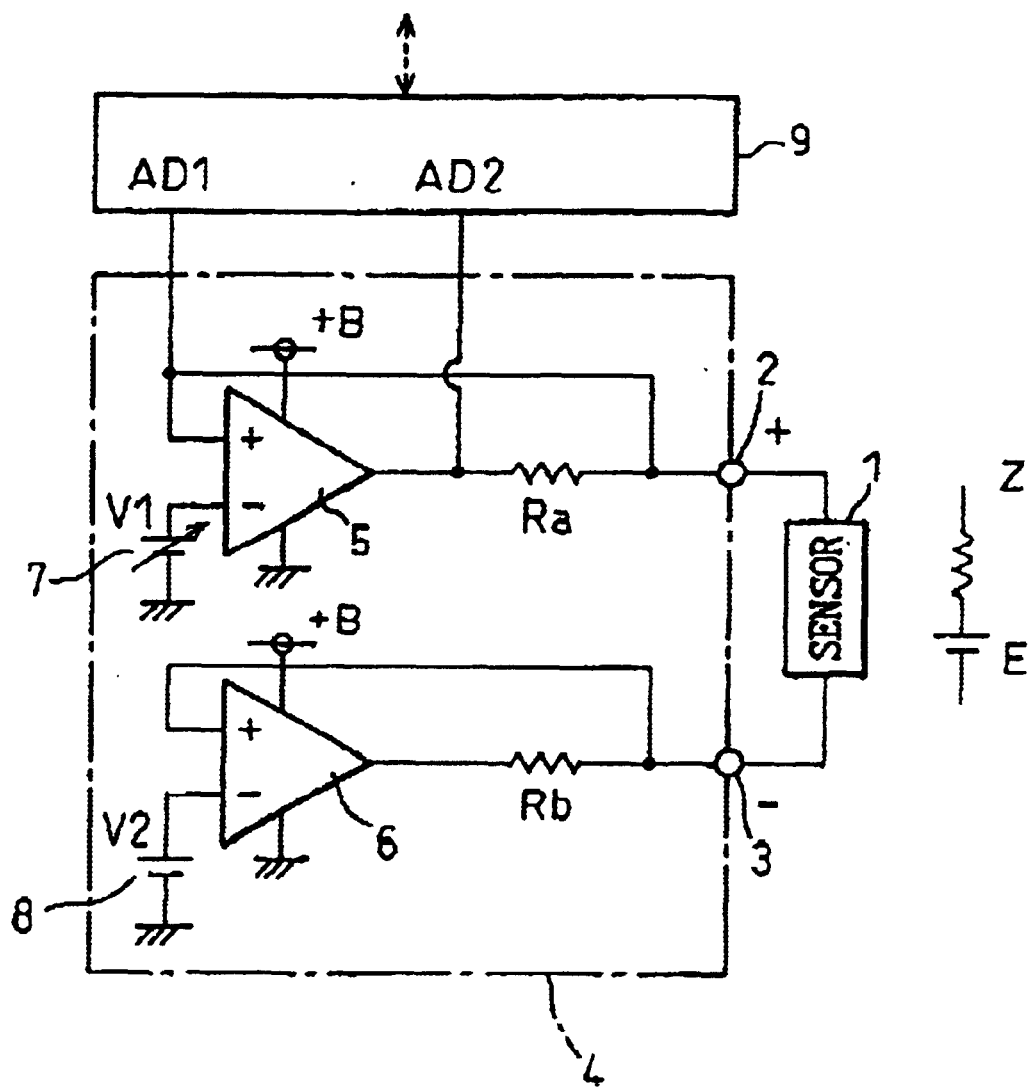
FIG. 3 is a diagram showing a sensor current detection circuit according to the prior art.
Figure 5:
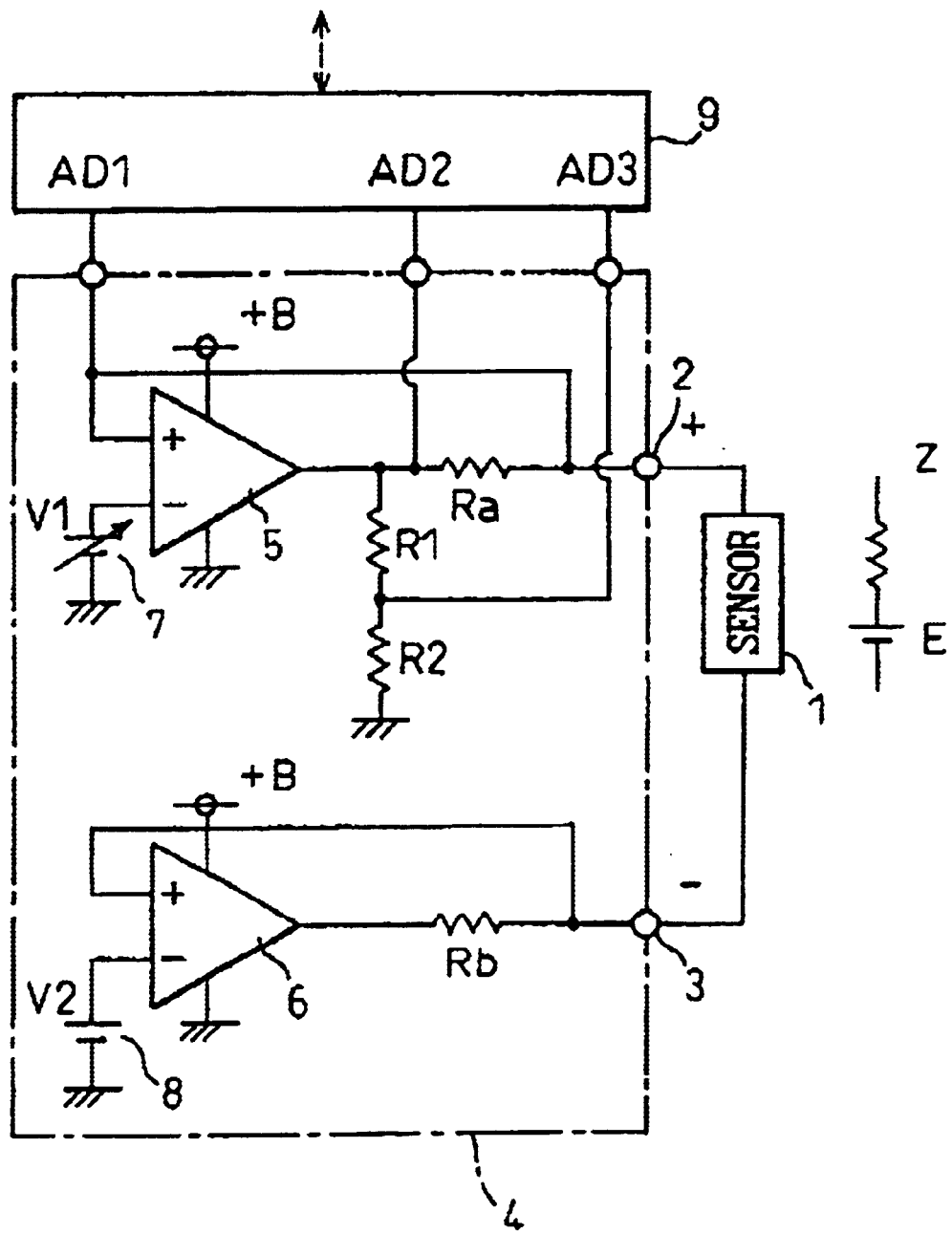
FIG. 5 is a diagram showing an A/F sensor current detection circuit according to a first embodiment of the present invention.

FIG. 5 is a circuit diagram showing an A/F sensor current detection circuit according to a first embodiment of the present invention, In the drawings given hereinafter, the same reference numerals as those used in FIG. 3 designate the same or similar component elements, and the description of such elements will not be repeated here.

In the embodiment shown in FIG. 5, series-connected voltage dividing resistors R1 and R2 are added between the output terminal of the operational amplifier 5 and the shunt resistor Ra, and the node connecting between the resistors R1 and R2 is connected to an input terminal AD3 on the AD converter 9. The resistance ratio of the resistors is chosen to be 1:1. In this embodiment, the input terminals AD1 and AD2 on the AD converter 9 are used when detecting the sensor current value, and the input terminals AD1 and AD3 on the AD converter 9 are used when detecting the element's admittance. Alternatively, the circuit may be configured so that the input terminals AD1 and AD2 are also used when detecting the element's admittance and, when the voltage at the input terminal AD2 is stuck at 5 V, then the input terminals AD1 and AD3 are used.

With this arrangement, not only can the sensor current value be measured in the same manner as in the prior art but, even when the voltage at the input terminal A of the AD converter 9 is stuck at 5 V during detection of the element's admittance, the element's admittance can be measured without any problem, because the voltage at the input terminal AD3 is one half that of the input terminal AD2 and thus falls within the 5-V input voltage range of the AD converter.

Figure 4:
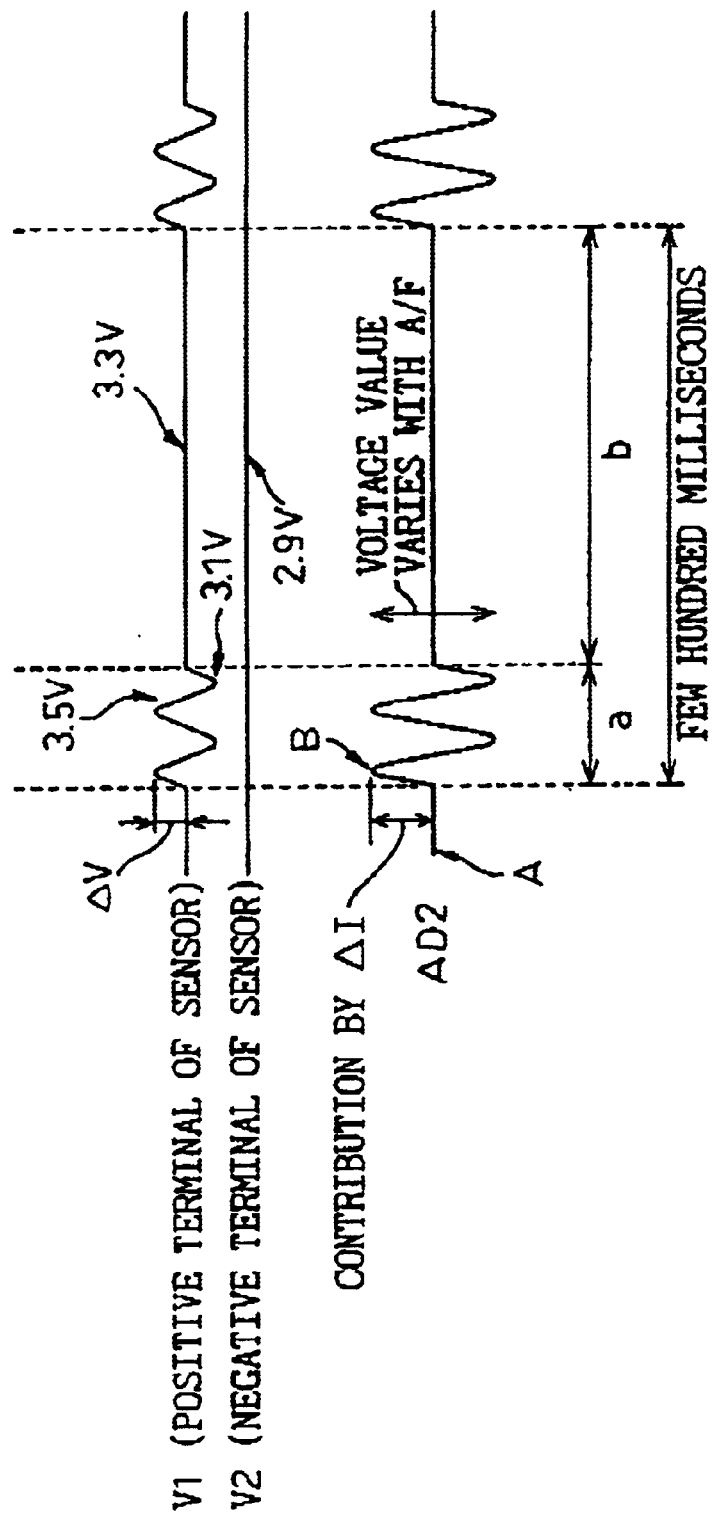
FIG. 4 is a waveform diagram for explaining the operation of the circuit shown in FIG. 3.

This will be explained by taking as an example the case of <Condition 2> given in the description of the prior art. In the case of <condition 2>, when A/F=18, the sensor current is 4 mA, as in <Condition 1>, but the voltage applied to the input terminal AD2 of the AD converter 9 is 5.3 V in the prior art circuit; on the other hand, in the present embodiment, the voltage applied to the input terminal AD3 of the AD converter 9 is 2.65 V which is well within the input voltage range of the AD converter, and therefore, does not cause any problem. Even in this case, as a voltage of 3.7 V can be obtained as the voltage at point A in FIG. 4, degradation in the sensor current detection accuracy due to reduced dynamic range does not occur.

Figure 6:
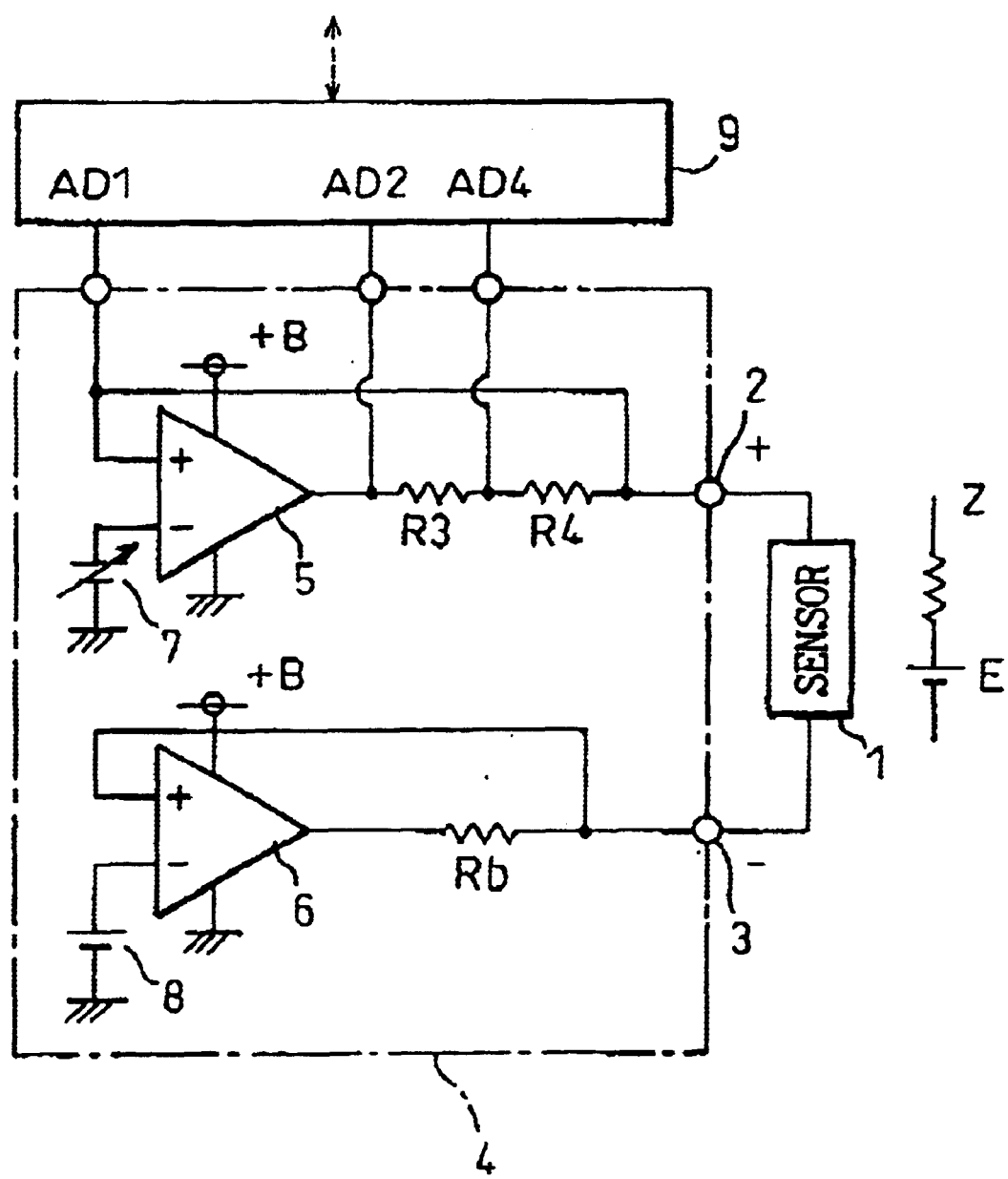
FIG. 6 is a diagram showing an A/F sensor current detection circuit according to a second embodiment of the present invention.

FIG. 6 shows a circuit diagram of a second embodiment of the present invention. In this embodiment, the resistor Ra in the prior art circuit shown in FIG. 3 is replaced by two resistors R3 and R4. The resistance value of each of the resistors R3 and R4 is chosen to be one half that of the resistor Ra of the prior art. That is, R3=R4=Ra/2.

Considering the case of <condition 2>, the input terminals AD1 and AD2 of the AD converter 9 are used when detecting the sensor current value, and a sensor current of 4 mA is obtained. On the other hand, when detecting the element's admittance, the input terminals AD1 and AD4 of the AD converter 9 are used. The voltage at the input terminal AD2 rises to 5.3 V during the voltage sweep, but the voltage at the input terminal AD4 is (5.3 V−3.3 V)/2+3.3 V=4.3 V which is within the input voltage range of the AD converter 9, and therefore, does not cause any problem. In this case also, as a voltage of 3.7 V can be obtained as the voltage at point A in FIG. 4, degradation in the sensor current detection accuracy due to a reduced dynamic range does not occur.

Alternatively, in this circuit also, provisions may be made to use the input terminals AD1 and AD2 for the measurement of the element's admittance when the voltage at the input terminal AD2 is 5 V or lower, and to use the input terminals AD1 and AD4 for the measurement of the element's admittance when the voltage at the input terminal AD2 exceeds 5 V due to the use of an A/F sensor having a different characteristic.

As described above, with reference to the preferred embodiments, the sensor current detection circuit of the present invention is capable of accurately detecting the element's admittance without causing degradation in the current detection accuracy even when the A/F sensor characteristic has changed due to a sensor design change or the like. The invention can thus provide a sensor current detection circuit capable of accommodating a change in the A/F sensor characteristic over a wide range.

What is claimed is:

1. A current detection circuit for an A/F sensor, comprising:

an operational amplifier for generating a voltage to be applied to said A/F sensor;

a current-measuring first resistor connected between said operational amplifier and said A/F sensor;

voltage-dividing second and third resistors connected in series with each other with one end thereof connected between said operational amplifier and said first resistor;

a first output terminal provided between said operational amplifier and said first resistor;

a second output terminal provided between said first resistor and said A/F sensor; and a third output terminal provided between said voltage-dividing second and third resistors, wherein said first and second output terminals are used for measuring a current value of said A/F sensor, and said second and third output terminals are used for measuring an element admittance of said A/F sensor.

2. A current detection circuit for an A/F sensor as claimed in claim 1, wherein said second and third resistors have a resistance ratio of 1:1.

3. A current detection circuit for an A/F sensor as claimed in claim 1, wherein when a voltage at said first output terminal does not exceed a predetermined value, the element admittance of said A/F sensor is detected using said first and second output terminals.

4. A current detection circuit for an A/F sensor as claimed in claim 3, wherein said predetermined value is a value that falls within an input voltage range of an AD converter which measures voltages at said first, second, and third output terminals.

5. A current detection circuit for an A/F sensor as claimed in claim 1, wherein said second and third resistors have a resistance ratio of 1:1.

6. A current detection circuit for an A/F sensor, comprising:

an operational amplifier for generating a voltage to be applied to said A/F sensor;

current-measuring first and second resistors connected in series between said operational amplifier and said A/F sensor;

a first output terminal provided between said operational amplifier and said first resistor;

a second output terminal provided between said first and second resistors; and a third output terminal provided between said second resistor and said A/F sensor wherein said first and third output terminals are used for measuring a current value of said A/F sensor and said second and third output terminals are used for measuring an element admittance of said A/F sensor.

7. A current detection circuit for an A/F sensor as claimed in claim 6, wherein said first and second resistors have a resistance ratio of 1:1.

8. A current detection circuit for an A/F sensor as claimed in claim 6 wherein, when a voltage at said first output terminal does not exceed a predetermined value, the element admittance of said A/F sensor is detected using said first and third output terminals.

9. A current detection circuit for an A/F sensor as claimed in claim 8, wherein said predetermined value is a value that falls within an input voltage range of an AD converter which measures voltages at said first, second, and third output terminals.

10. A current detection circuit for an A/F sensor as claimed in claim 6, wherein said first and second resistors have a resistance rate of 1:1.

* * * * *